United States Patent
Li et al.

(10) Patent No.: US 12,015,244 B2
(45) Date of Patent: Jun. 18, 2024

(54) DFB LASER DC-COUPLED OUTPUT POWER CONFIGURATION SCHEME WITH ADJUSTABLE VOLTAGE DIFFERENCE

(71) Applicant: XIAMEN EOCHIP SEMICONDUCTOR CO., LTD, Xiamen (CN)

(72) Inventors: Jinghu Li, Xiamen (CN); Zhang Fan, Xiamen (CN); Liangqiong Shi, Xiamen (CN); Weitan Yao, Xiamen (CN); Weiyin Zheng, Xiamen (CN); Hanghui Tu, Xiamen (CN)

(*) Notice: Subject to any disclaimer, the term of this patent is extended or adjusted under 35 U.S.C. 154(b) by 0 days.

(21) Appl. No.: 18/004,054

(22) PCT Filed: Dec. 24, 2021

(86) PCT No.: PCT/CN2021/141133
§ 371 (c)(1),
(2) Date: Jun. 22, 2023

(87) PCT Pub. No.: WO2023/108794
PCT Pub. Date: Jun. 22, 2023

(65) Prior Publication Data
US 2024/0047942 A1 Feb. 8, 2024

(30) Foreign Application Priority Data
Dec. 16, 2021 (CN) .......................... 202111542869.5

(51) Int. Cl.
*H01S 5/062* (2006.01)
*H01S 5/042* (2006.01)
(Continued)

(52) U.S. Cl.
CPC ........ *H01S 5/06203* (2013.01); *H01S 5/0427* (2013.01); *H01S 5/12* (2013.01); *H04B 10/40* (2013.01)

(58) Field of Classification Search
CPC .... H01S 5/06203; H01S 5/0427; H01S 5/042; H01S 5/06832; H04B 10/40; H02M 1/092; H02M 3/156; Y02B 70/10
See application file for complete search history.

(56) References Cited

U.S. PATENT DOCUMENTS

| 2008/0304527 A1* | 12/2008 | Gao | ................... H01S 5/06808 372/38.02 |
| 2012/0301151 A1* | 11/2012 | Hu | ........................ H04B 10/40 315/117 |

(Continued)

*Primary Examiner* — Xinning(Tom) Niu
(74) *Attorney, Agent, or Firm* — Novoclaims Patent Services LLC; Mei Lin Wong

(57) ABSTRACT

A DFB laser DC-coupled output power configuration scheme with adjustable voltage difference. utilizes an external or internal power configuration unit to provide two electric DC power supplies with a fixed voltage difference for the transmitting unit TX of the DFB laser and the optical transceiver integrated chip, and at the same time optimizes the transmitting unit TX. The optimization scheme is that: the transistors in the transmitting unit TX are all low-voltage high-speed tubes, the transmitting unit TX includes a negative capacitance structure composed of capacitors C1 and C2, serving as an auxiliary structure for improving bandwidth. After optimization, the minimum voltage of the power supply voltage port TVCC of the transmitting unit TX is 2.7V and the problems that the output eye diagram is severely cracked and cannot be used when the traditional DFB laser configuration scheme with an external 3.3V power supply is tested at high temperature are solved.

9 Claims, 7 Drawing Sheets

(51) Int. Cl.
 *H01S 5/12* (2021.01)
 *H04B 10/40* (2013.01)

(56) References Cited

U.S. PATENT DOCUMENTS

2016/0372888 A1* 12/2016 Tan ..................... H01S 5/0427
2018/0196287 A1*  7/2018 Hissen .................. G05F 1/585

* cited by examiner

DFB LASER DC-COUPLED OUTPUT POWER CONFIGURATION SCHEME WITH ADJUSTABLE VOLTAGE DIFFERENCE

FIELD OF INVENTION

The present invention relates to o a DFB laser DC-coupled output power configuration scheme with adjustable voltage difference, which belongs to the field of laser driver in optical communication integrated circuit.

DESCRIPTION OF RELATED ARTS

At the transmitting end of the optical fiber communication integrated circuit, the laser driver (Laser Diode Driver) turns on or off the laser according to a logic value of the data stream and uses an optical fiber to transmit the optical signal over a long distance, the receiving end then converts the current signal into a voltage signal through a transimpedance amplifier (TIA). As shown in FIG. 2, the laser (Laser Diode) must be biased near the threshold $I_{th}$ so that the laser current increases rapidly to switch on the laser. Referring to FIG. 1, a circuit schematic diagram of the commonly used laser driver DC-coupled laser circuit is illustrated. The laser driver must provide a bias current ($I_{bias}$) and a modulation current ($I_{mod}$). The bias current of the laser needs to be continuously adjusted for temperature changes and aging, and the modulation current also needs to change the luminous efficiency (ER) of the laser.

FIG. 3 illustrates a conventional DFB laser configuration scheme with an external 3.3V power supply. DFB (Distributed Feedback Laser, distributed feedback) laser can provide a relatively high output power, and is suitable for high-speed long-distance optical signal transmission. The high-speed optical transceiver integrated chip (Transceiver) is connected to the DFB laser by means of DC coupling. The advantages of the DC coupling method of the laser compared with the AC coupling method are as follows: (1) DC coupling has no time delay caused by AC coupling capacitors, faster response speed, and multi-rate compatibility, which can be used in applications in ultra-high-speed optical transmitters and burst optical transmitters. (2) The DC coupling uses a lower bias current and the modulation current can be used as the average power output, so its power consumption is lower. (3) Fewer peripheral devices, and easier impedance matching.

However, the problem of headroom voltage brought about by the DC coupling method is also more prominent. In the case of high-speed switching of laser, the laser needs a forward voltage V F (Forward-bias Voltage) of about 1.2V-1.8V. As shown in FIG. 3, which illustrates a simplified laser equivalent circuit, the forward voltage $V_F$ is equal to the sum of the voltage drop across the bandgap voltage $V_{BG}$ and the equivalent series resistance $R_L$ of the laser, and the formula is:

$$V_F = V_{BG} + R_L \cdot I$$

Under room temperature, the $V_{BG}$ of the DFB laser is about 0.7V, the RL is equal to 5Ω, the input current of the forward voltage terminal is $I = I_{bias} + I_{mod} = 35$ mA+80 mA=115 mA, so $V_F$=1.275V.

The transient voltage drop $V_L$ is caused by the rapidly changing current through the laser package parasitic inductance L. The package inductance L of a 10 Gbps DFB laser is about 0.4 nH, the time of increasing and decreasing 20%-80% of the 80 mA modulation current is 20 ps, and the effective modulation current is 60%*80 mA=48 mA, according to the formula:

$$V_L = L \frac{\Delta i}{\Delta t}$$

Calculate $V_L$=0.96V. Δi is the variation of the modulation current per unit time, that is, 48 mA. Δt is the unit time, which is 20 ps.

The modulation current flowing through the damping resistor $R_A$ also produces a voltage drop: $V_{RA} = R_A * I_{mod} = 5Ω * 80$ mA=0.4V.

In the case of high-power output of the laser, the voltage of the OUTP terminal of the transmitting unit TX in the optical transceiver integrated chip will drop to the lowest point, and its expression is:

$$V_{LOW} = LVCC - V_F - V_L - V_{RA}$$

where LVCC is the power supply voltage of the DFB laser, when the value is 3.3V, $V_{Low}$=3.3−1.275−0.96−0.4=0.665V.

Under room temperature, when using the conventional DFB laser configuration scheme with external 3.3V power supply as shown in FIG. 4, the power supply voltage TVCC of the transmitting unit TX in the optical transceiver integrated chip (Transceiver) and the power supply voltage LVCC of the DFB laser are both 3.3V, then the slew voltage of the OUTP terminal of the transmitting unit TX is 0.665V. This voltage is already close to the sum 0.6V of the collector-emitter voltage of the internal device under high-speed operation. When the operating temperature is further increased to 85° C., the modulation current and bias current of the DFB laser will increase, then the slew voltage of the OUTP terminal will be less than 0.6V, and the internal device cannot respond to the switching of the data stream at a high speed, the quality of the eye diagram is cracked, and the transimpedance amplifier TIA at the receiving end cannot correctly receive the optical signal.

FIG. 8 is an output eye diagram of the conventional DFB laser configuration scheme with an external 3.3V power supply at room temperature of 25° C., the output power is +5.5 dBm, and the eye opening margin Margin=38.6%.

FIG. 9 is an output eye diagram of the conventional DFB laser configuration scheme with an external 3.3V power supply at a high temperature of 85° C., the output power is +4.5 dBm, and the eye opening margin Margin=13.9%.

FIG. 10 is an output eye diagram of the conventional DFB laser configuration scheme with an external 3.3V power supply at a low temperature of −40° C., the output power is +6 dBm, and the eye opening margin Margin=23.2%.

It can be seen that under high temperature, the output power of the DBF laser is low, and the eye opening margin is only 13.9%, which cannot meet the performance requirements of optical transmission in extreme environments.

In order to solve the above-mentioned headroom voltage problem, the most simple and effective method is to increase the power supply voltage LVCC of the DFB laser. As shown in FIG. 5, the conventional DFB laser configuration scheme with an external DC/DC boost module is illustrated. In this scheme, a DC/DC boost module is added outside the optical transceiver integrated chip, and the conventional voltage of 3.3V is raised to 4V as the power supply voltage LVCC of the DFB laser, while the power supply voltage TVCC of the transmitting unit TX still uses the 3.3V. In this case, $V_{LOW}$ is equal to 1.365V, there is still a considerable voltage margin from the sum 0.6V of the collector-emitter voltages under the high-speed operation of the internal devices to meet the performance requirements of high temperature operation. As the modulation current bias current increases, $V_{LOW}$ decreases further and the performance requirements of the output eye quality without cracking is met.

In practical applications, although the conventional DFB laser configuration scheme with an external 3.3V power supply is simple to implement, the laser driver fails to switch the DFB laser at high speed to emit high-quality transmission light due to insufficient headroom voltage margin when working under a high temperature environment. On the other hand, by using the conventional DFB laser configuration scheme with an external DC/DC boost module, the DFB laser can finally output high-quality transmission light under high temperature conditions. However, this configuration scheme adds many peripheral circuits, increases the difficulty of debugging, increases the power consumption, and most importantly, dramatically increases the economic cost.

SUMMARY OF THE PRESENT INVENTION

An object of the present invention is to solve the existing problems that the output eye diagram is severely cracked and is unusable in the conventional DFB laser power supply configuration scheme with an external 3.3V power supply when tested under high temperature, and provide a DFB laser DC-coupled output power configuration scheme with adjustable voltage difference.

According to the DFB laser DC-coupled output power configuration scheme with adjustable voltage difference of the present invention, the power configuration scheme adopts an external power configuration unit to provide two electric DC power supplies with a fixed voltage difference to a DFB laser and a transmitting unit TX of an optical transceiver integrated chip, the external power configuration unit comprises a DC voltage source VDC3.3V and a low-dropout-like linear voltage stabilizer, and the low-dropout-like linear voltage stabilizer includes a resistor R5, a resistor R6, a resistor R12, a resistor R13, a PMOS power resister MP and an operational amplifier AMP;
  one end of the resistor R6 is simultaneously connected to one end of the resistor R5 and the inverting input terminal of the operational amplifier AMP;
  a non-inverting input terminal of the operational amplifier AMP is simultaneously connected to one end of the resistor R12 and one end of the resistor R13;
  another end of the resistor R13 is simultaneously connected to a drain end of a PMOS power transistor MP and a voltage output port $V_{OUT}$, and the voltage output port $V_{OUT}$ is arranged to output a working power of the transmitting unit TX of the optical transceiver integrated chip;
  the voltage output port $V_{OUT}$ is connected to a power supply voltage port TVCC of the transmitting unit TX;
  a gate end of the PMOS power transistor MP is connected to an output terminal of the operational amplifier AMP;
  a source end of the PMOS power resister MP and another end of the resistor R5 are connected to a positive terminal of the DC voltage source VDC;
  another end of the resistor R12, another end of the resistor R6 and a negative terminal of the DC voltage source VDC are connected to the ground;
  the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;
  after optimization, a minimum voltage of the power supply voltage port TVCC of the transmitting unit TX is 2.7V.

Preferably, the working power supply voltage provided by the external power supply configuration unit for the transmitting unit TX of the optical transceiver integrated chip is:

$$V_{OUT} = VDC \cdot \frac{R6(R12 + R13)}{R12(R5 + R6)}$$

By adjusting the resistance values of resistor R5, resistor R6, resistor R12, and resistor R13, the output voltage $V_{OUT}$ is changed, and hence the voltage difference between the two DC power supplies is adjusted.

The preset invention also provides another technical solution, and the DFB laser DC-coupled output power configuration scheme with adjustable voltage difference is:
  utilize a DC voltage source VDC3.3V as a working power supply of a DFB laser;
  at the same time, arrange an internal power configuration unit inside an optical transceiver integrated chip. The working power supply of a transmitting unit TX of the optical transceiver integrated chip is obtained from the DC voltage source VDC3.3V after being processed by the internal power supply configuration unit.

In order to realize that: the working power supply of the transmitting unit TX of the optical transceiver integrated chip and the working power supply of the DFB laser DFB_Laser have a fixed voltage difference;
  specifically: a positive terminal of the DC voltage source VDC3.3V is simultaneously connected to a power supply voltage port LVCC of the DFB laser DFB_Laser and a power supply voltage port TVCC of the transmitting unit TX of the optical transceiver integrated chip; a negative terminal of the DC voltage source VDC3.3V is grounded; an input terminal of an internal power configuration unit is connected to the power supply voltage port TVCC of the transmitting unit TX, an output terminal of the internal power configuration unit is connected to an internal working power port VCCT of the transmitting unit TX, a voltage differential modulation terminal of the internal power configuration unit is connected to a modulation port CTL of the transmitting unit TX;
  the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;
  after optimization, a minimum voltage of the power supply voltage port TVCC of the transmitting unit TX is 2.7V.

Preferably, the internal power configuration unit comprises a low-dropout linear voltage stabilizer, and the low-dropout linear voltage stabilizer comprises a resistor R5, a resistor R6, a resistor R12, a resistor R13, a PMOS power resister MP and an operational amplifier AMP;

one end of the resistor R6 is simultaneously connected to one end of the resistor R5 and the inverting input terminal of the operational amplifier AMP;

a non-inverting input terminal of the operational amplifier AMP is simultaneously connected to one end of the resistor R12 and one end of the resistor R13;

another end of the resistor R13 is simultaneously connected to a drain end of a PMOS power transistor MP and an internal working power port VCCT of the transmitting unit TX of the optical transceiver integrated chip;

a gate terminal of the PMOS power transistor MP is connected to an output terminal of the operational amplifier AMP;

a source terminal of the PMOS power transistor MP and another end of the resistor R5 are connected to a power supply voltage port TVCC of the transmitting unit TX;

another end of the resistor R12 and another end of the resistor R6 are connected to the ground;

the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;

after optimization, a minimum voltage of the power supply voltage port VCCT of the transmitting unit TX is 2.7V.

Preferably, the internal power supply configuration unit comprises a programmable module, and the programmable module is arranged to adjust resistance values of the resistor R5, the resistor R6, the resistor R12, the resistor R13 so as to realize the adjustment of the voltage difference between the two working power sources.

Preferably, the programmable module adopts an analog programmable module or a digital programmable module.

Preferably, the digital programmable module is realized by a one-time programmable OTP or register programming, and a process of voltage difference adjustment is: first determine a pre-realized voltage difference value between the two working power supplies, then write digital characters as commands through the modulation port CTL of the transmitting unit TX, and the programmable module rewrite the resistance value of the resistor R5, the resistor R6, the resistor R12, an the resistor R13 according to the commands so as to realize the voltage difference adjustment.

Preferably, the analog programmable modules is realized by laser trimming or fuse trimming.

Preferably, the working power supply voltage provided by the internal power supply configuration unit for the transmitting unit TX of the optical transceiver integrated chip is:

$$VCCT = VDC \cdot \frac{R6(R12 + R13)}{R12(R5 + R6)}.$$

The advantageous effect of the present invention: The present invention provides a DFB laser DC-coupled output power configuration scheme with adjustable voltage difference, which abandons the traditional 3.3V power supply voltage configuration scheme that simultaneously supplies the transmitting unit TX inside the transceiver integrated chip and the laser power supply voltage, and abandon the 3.3V power supply voltage to supply the transmitter unit TX inside the optical transceiver integrated chip and the configuration scheme of using the boost chip DC/DC to output 4V voltage to the laser power supply voltage, and adopts an optimized internal design from which the transmitter TX of the optical transceiver integrated chip works at a power supply voltage lower than 3.3V, and the laser power supply voltage is 3.3V (a fixed voltage difference is generated between TVCC and LVCC), which can improve the eye diagram performance of the laser under high temperature condition, and change the setting of the headroom voltage margin by changing the resistance value in the internal structure, while reducing the cost and power consumption of the entire module at the same time, and having passed the actual test verification.

DETAILED DESCRIPTION OF THE PREFERRED EMBODIMENT

Figure 6:
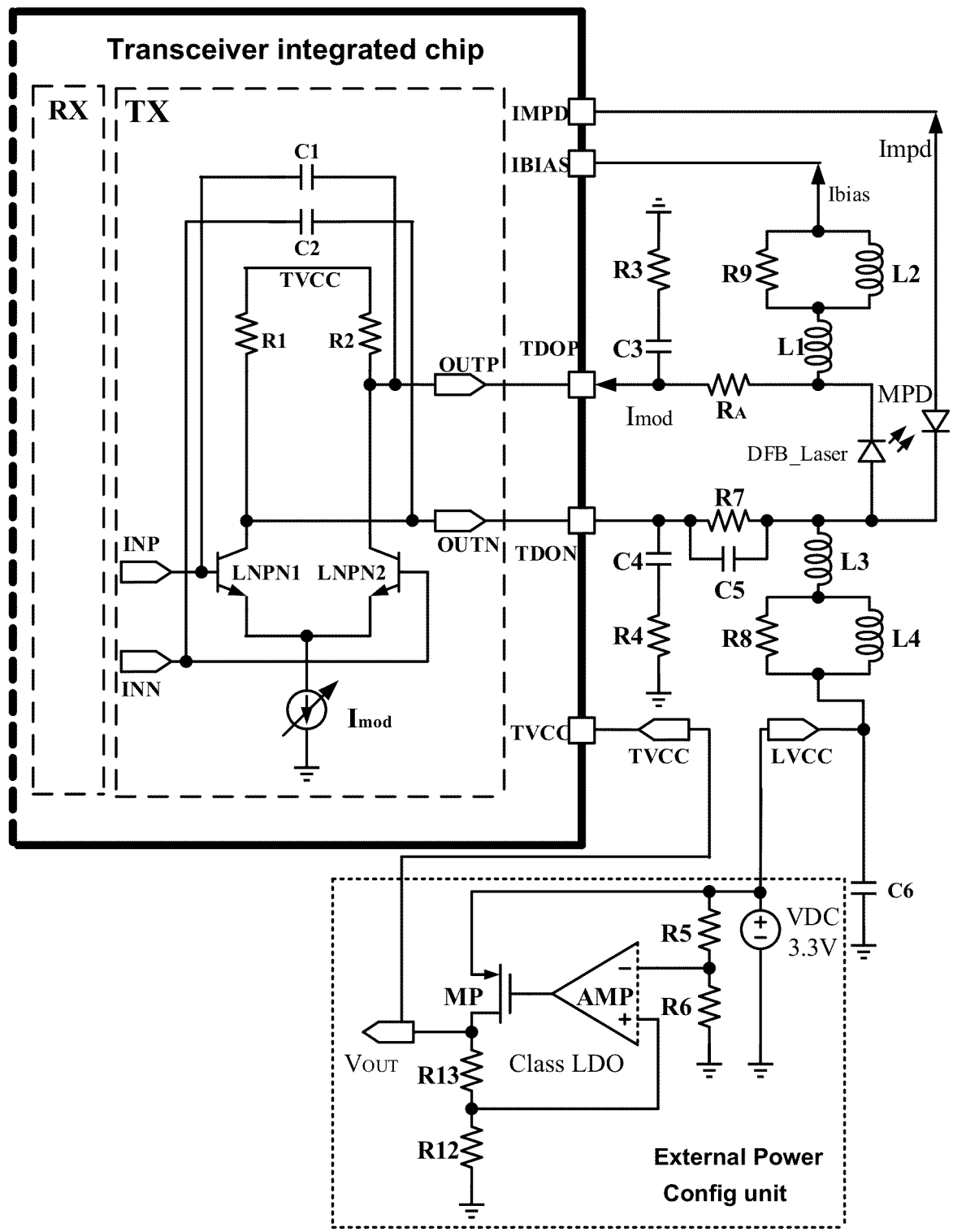
FIG. 6 is a schematic diagram of the structure of DFB laser DC-coupled output power supply configuration scheme with adjustable voltage difference (configuration scheme 1) according to the present invention.

Embodiment 1: This embodiment is described below with reference to FIGS. 6, 8~12. According to the DFB laser DC-coupled output power configuration scheme with adjustable voltage difference of this embodiment, an external power supply configuration unit is employed. Referring to FIG. 6, this configuration includes two parts, one part is the structural design of the external power supply configuration unit, and the other part is the optimization of the transmitting unit TX of the optical transceiver integrated chip.

The external power supply configuration unit has two outputs, one output 3.3V is connected to the power supply voltage port LVCC of the DFB laser DFB_Laser, and the other output is $$V_{OUT} = VDC \cdot \frac{R6(R12 + R13)}{R12(R5 + R6)},$$

which is connected to a power terminal TVCC of the optical transceiver integrated chip.

The power configuration scheme adopts an external power configuration unit to provide two electric DC power supplies with a fixed voltage difference for the DFB laser and the optical transceiver integrated chip. The external power configuration unit includes a DC voltage source VDC3.3V and a low-dropout-like linear voltage stabilizer. The low-dropout-like linear voltage stabilizer comprises a resistor R5, a resistor R6, a resistor R12, a resistor R13, a PMOS power resistor MP and an operational amplifier AMP;
one end of the resistor R6 is simultaneously connected to one end of the resistor R5 and the inverting input terminal of the operational amplifier AMP;
a non-inverting input terminal of the operational amplifier AMP is simultaneously connected to one end of the resistor R12 and one end of the resistor R13;
another end of the resistor R13 is simultaneously connected to a drain end of a PMOS power transistor MP and a voltage output port $V_{OUT}$, and the voltage output port $V_{OUT}$ is arranged to output the working power of the transmitting unit TX of the optical transceiver integrated chip, the voltage output port $V_{OUT}$ is connected to a power supply voltage port TVCC of the transmitting unit TX;
a gate terminal of the PMOS power transistor MP is connected to an output terminal of the operational amplifier AMP;
a source terminal of the PMOS power transistor MP and another end of the resistor R5 are connected to a positive terminal of a DC voltage source VDC;
another end of the resistor R12, another end of the resistor R6, and the negative terminal of the DC voltage source VDC are connected to the ground;
the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;
after optimization, a minimum voltage of the power supply voltage port TVCC of the transmitting unit TX is 2.7V.

The working power supply voltage provided by the external power supply configuration unit for the transmitting unit TX of the optical transceiver integrated chip is:

$$V_{OUT} = VDC \cdot \frac{R6(R12 + R13)}{R12(R5 + R6)}$$

By adjusting the resistance values of resistor R5, resistor R6, resistor R12, and resistor R13, the output voltage $V_{OUT}$ is changed, and hence the voltage difference between the two DC power supplies is adjusted.

The present invention provides a DFB laser DC-coupled output power supply configuration scheme with adjustable voltage difference, and the adjustable voltage difference is the key to the realization of the present invention.

In explaining the traditional laser power configuration scheme, if a unified 3.3V voltage is used to supply the chip and the laser, it will cause the problem of headroom voltage, which will affect the output quality of the eye diagram under high temperature conditions. If the laser is powered by boosting, the peripheral devices required for this solution will increase, and the power consumption and cost will also increase. The power supply configuration scheme with adjustable voltage difference as provided in FIG. 6 can well solve the above two problems, that is, superior performance and low cost.

Figure 1:
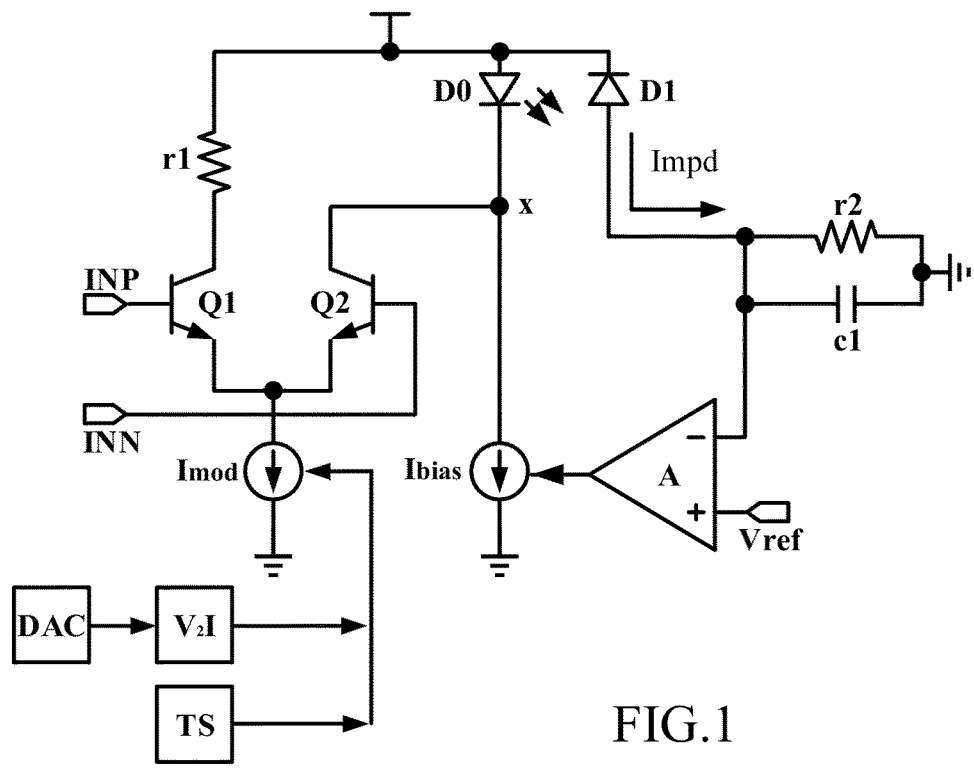
FIG. 1 is a schematic diagram of a commonly used laser driver DC-coupled laser circuit.
Figure 2:
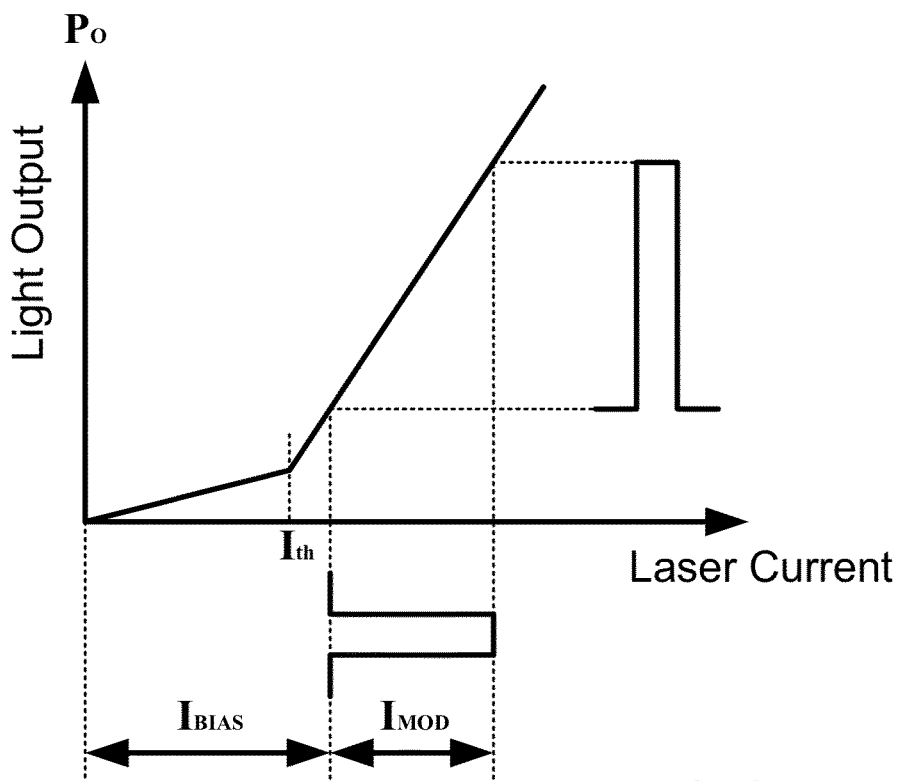
FIG. 2 is a schematic diagram of the input and output characteristics of a laser.
Figure 3:
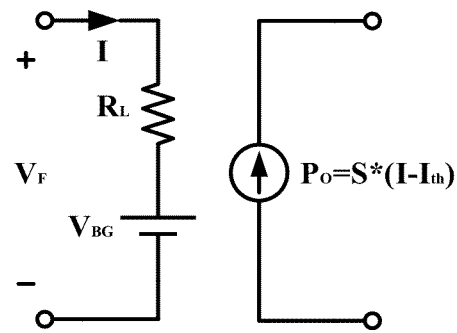
FIG. 3 is simplified laser equivalent circuit diagram.
Figure 4:
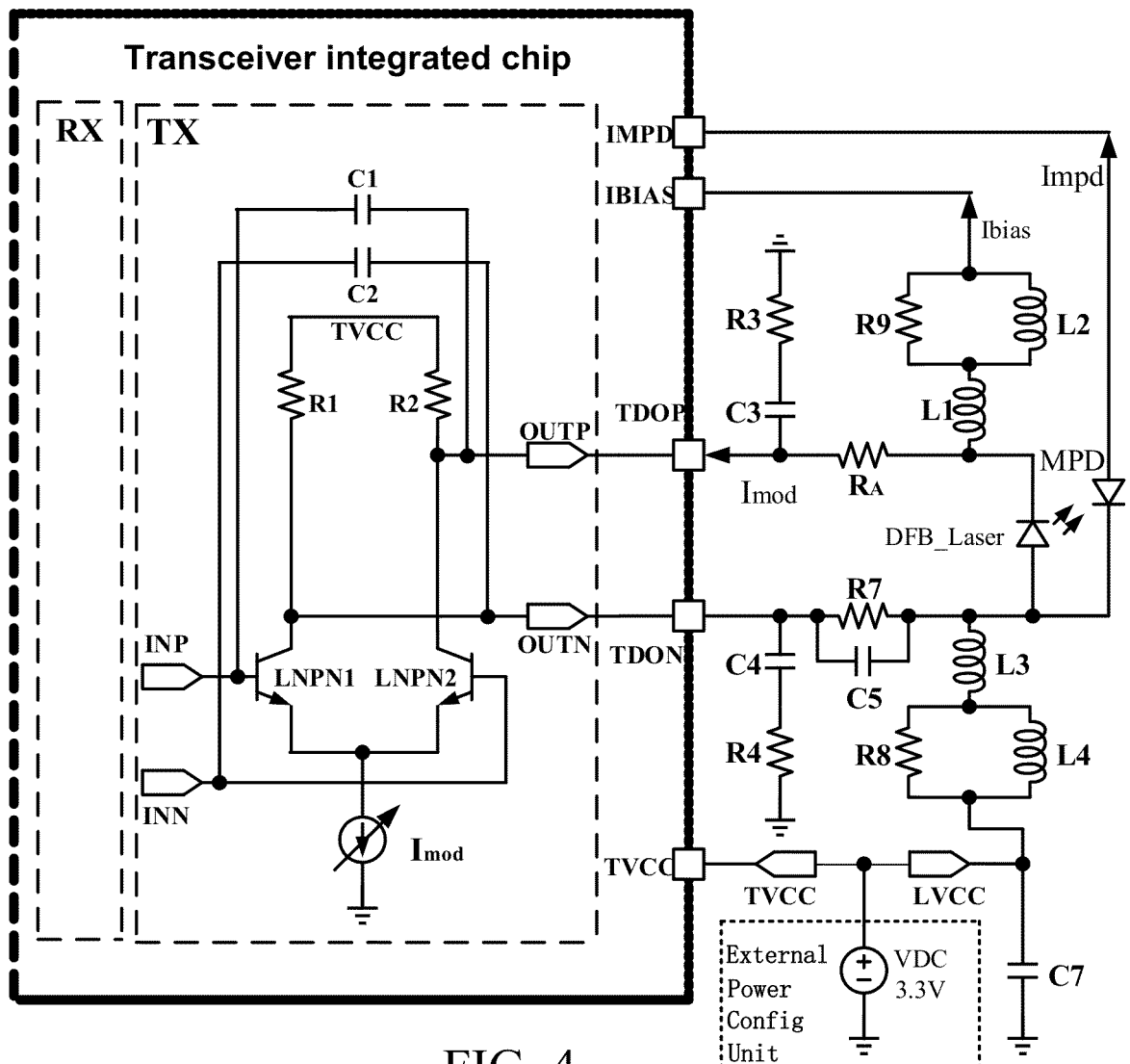
FIG. 4 is a conventional DFB laser configuration scheme with an external 3.3V power supply.
Figure 5:
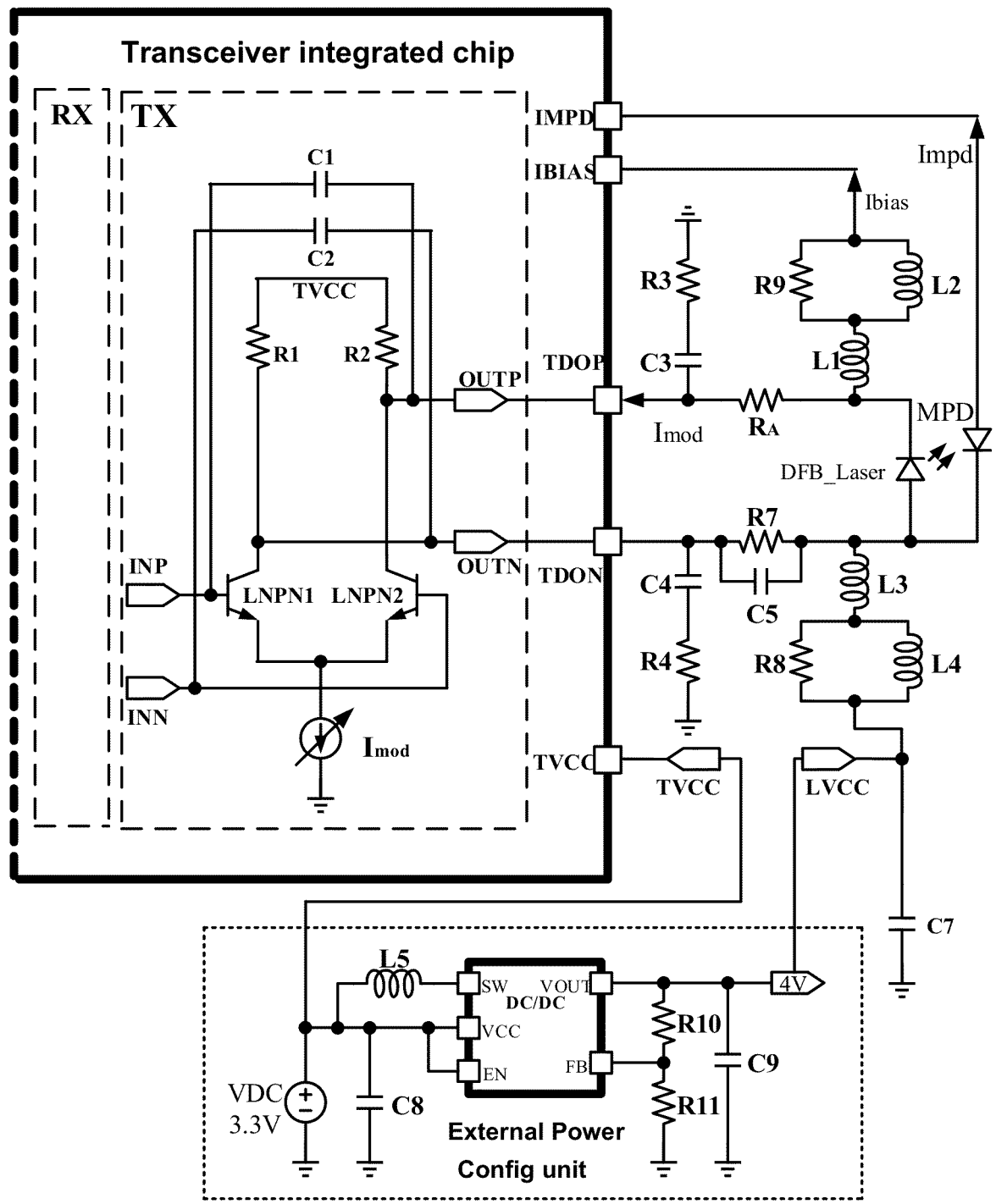
FIG. 5 is a conventional DFB laser configuration scheme with an external DC/DC boost module.

The power configuration scheme as shown in FIG. 5 is to increase the power supply voltage of the laser, so that the headroom voltage margin is larger to improve the high temperature performance. The design idea of FIG. 6 is the opposite. The power supply voltage of the laser still adopts the conventional VDC3.3V voltage, and the power supply voltage of the chip transmitter unit TX is stepped down by a conventional 3.3V voltage through an LDO-like (low dropout linear regulator) and then connected to the power supply voltage port TVCC of the chip transmitting part. The voltage value of TVCC is $$V_{OUT} = VDC \cdot \frac{R6(R12 + R13)}{R12(R5 + R6)},$$

therefore the required $V_{OUT}$ value is obtained by reasonably adjusting the resistance value in the formula.

When the resistance value in the formula is fixed, the voltage difference between TVCC and LVCC will be fixed accordingly. The range of the voltage difference can be between 100 mV-600 mV, and the optimal voltage difference can be selected in exchange for the optimal eye diagram performance under high temperature of the laser.

After the power supply voltage of the chip transmitting unit TX is $V_{OUT}$, the sum of the voltage between the collector and the emitter will further drop by several hundred millivolts under the condition of high-speed operation of its internal devices, which is lower than the 0.6V mentioned above. Then, when the laser works at high temperature, after the modulation current bias current increases, there is still a certain headroom voltage margin, so that the laser driver can turn on and off the laser at high speed and emit high-quality light.

In order to realize the design concept of this configuration scheme, the circuit of the chip transmitting unit TX should be optimized at the beginning of the chip design, so that it can still turn on and off the laser at high speed with the data flow under low power supply voltage. For example, the transistor in the circuit adopts a low-voltage high-speed transistor LNPN, and adopts an auxiliary structure to increase the bandwidth (the connection of capacitors C1 and C2 forms a negative capacitance structure to improve the working speed), etc.

Figure 11:
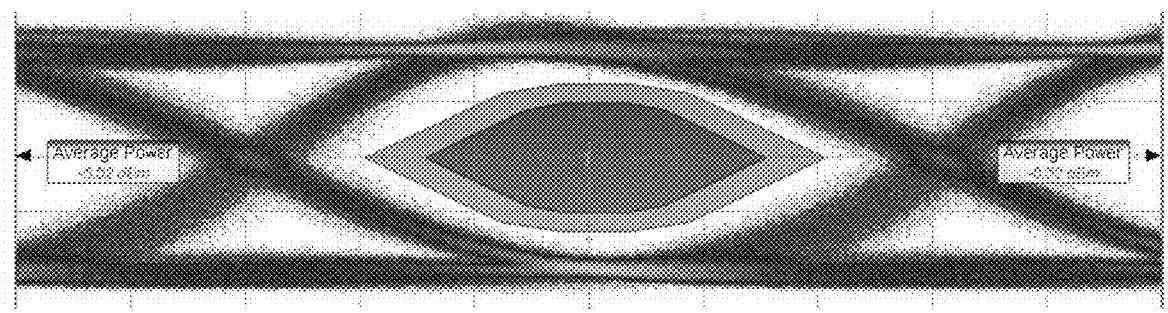
FIG. 11 is an output eye diagram of a DFB laser DC-coupled output power configuration scheme with adjustable voltage difference at 25° C.

FIG. 11 is an output eye diagram of a DFB laser DC-coupled output power configuration scheme with adjustable voltage difference under room temperature of 25° C., the output power is +6.5 dBm, and the eye opening margin Margin=35.1%.

Figure 12:
FIG. 12 is an output eye diagram of a DFB laser DC-coupled output power configuration scheme with adjustable voltage difference at 85° C.

FIG. 12 is an output eye diagram of a DFB laser DC-coupled output power configuration scheme with adjustable voltage difference under high temperature of 85° C., the output power is +5.1 dBm, and the eye opening margin Margin=21%.

Figure 13:
FIG. 13 is an output eye diagram of a DFB laser DC-coupled output power configuration scheme with adjustable voltage difference at −40° C.

FIG. 13 is an output eye diagram of a DFB laser DC-coupled output power configuration scheme with adjustable voltage difference under low temperature of −40° C., the output power is +6.5 dBm, and the eye opening margin Margin=24.9%.

Compared with the test data of the unified 3.3V power supply voltage, the test data of this embodiment has an overall increase of about 1dBm in the three-temperature power, the output eye diagram is better, and there is no obvious overshoot problem, especially under the high temperature of 85° C., the eye opening margin is 21%, and the performance is improved.

The DFB laser DC-coupled output power configuration scheme with adjustable voltage difference of the present invention does not use the conventional boost chip to supply power to the laser to improve the headroom voltage margin, but uses an LDO-like structure to reduce the power supply voltage of the TX, and changes the resistance value in the structure to flexibly set the headroom voltage margin. The above changes in the power configuration scheme can reduce the power consumption and cost of the entire module, and improve the quality of the laser output eye diagram.

Figure 7:
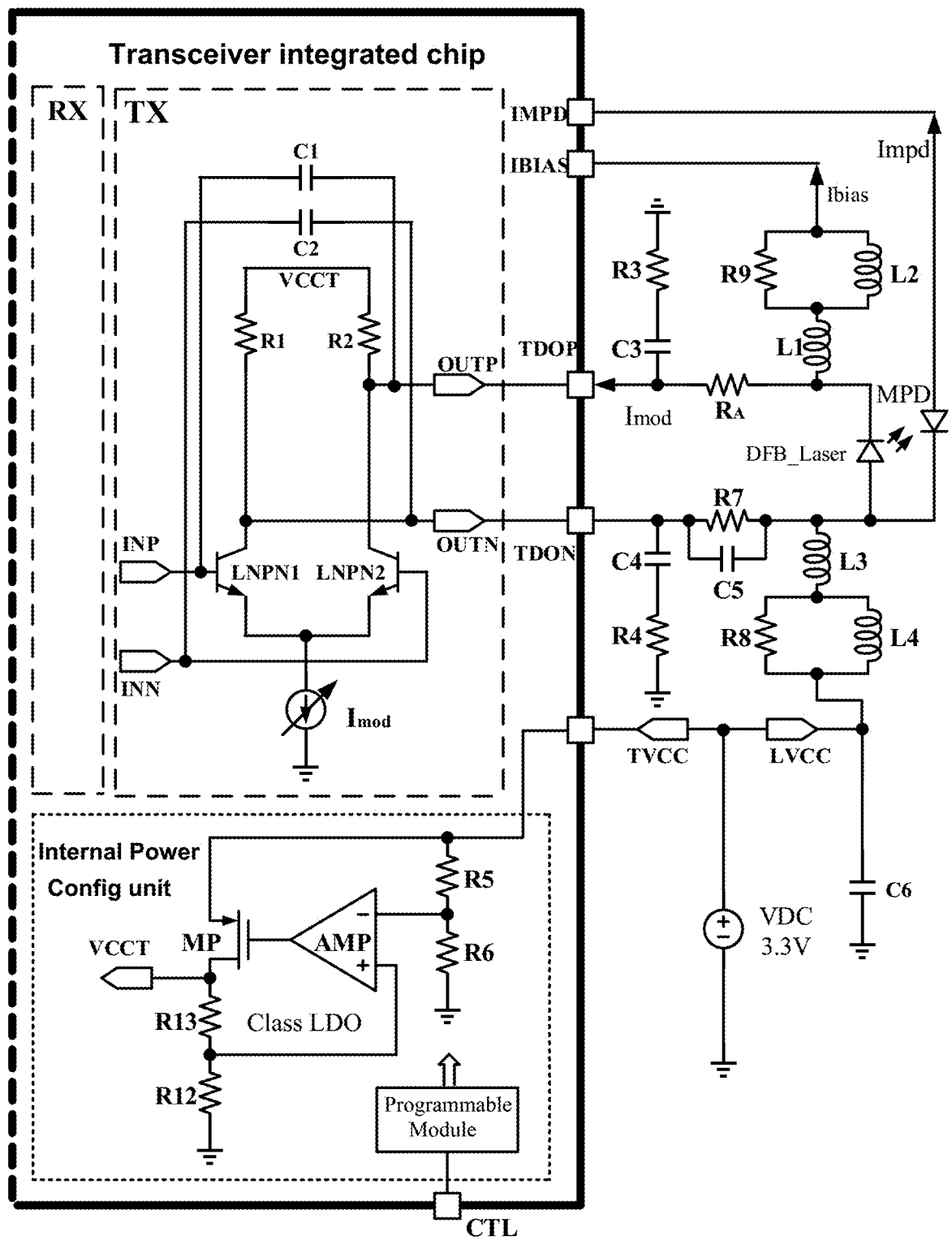
FIG. 7 is a schematic diagram of the structure of DFB laser DC-coupled output power supply configuration scheme with adjustable voltage difference (configuration scheme 2) according to the present invention.
Figure 8:
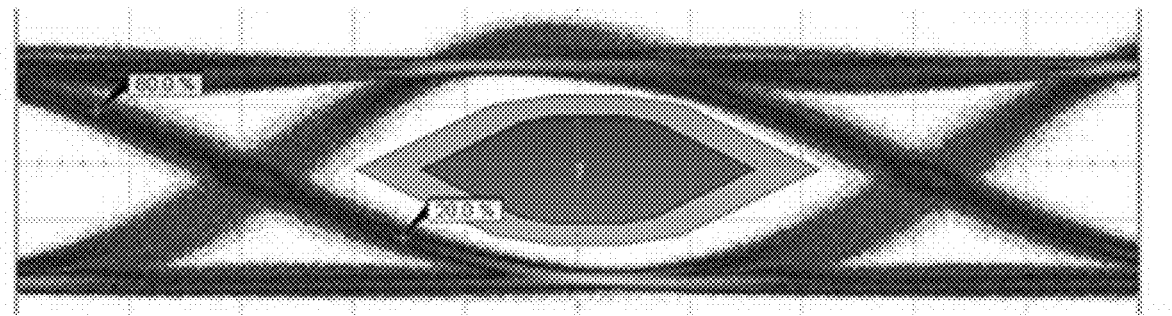
FIG. 8 is an output eye diagram of the conventional DFB laser configuration scheme with an external 3.3V power supply at 25° C. condition.
Figure 9:
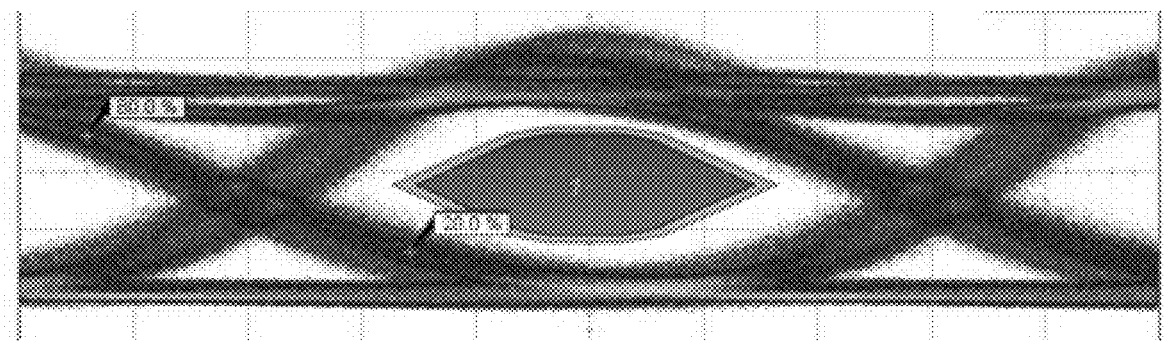
FIG. 9 is an output eye diagram of the conventional DFB laser configuration scheme with an external 3.3V power supply at 85° C. condition.
Figure 10:
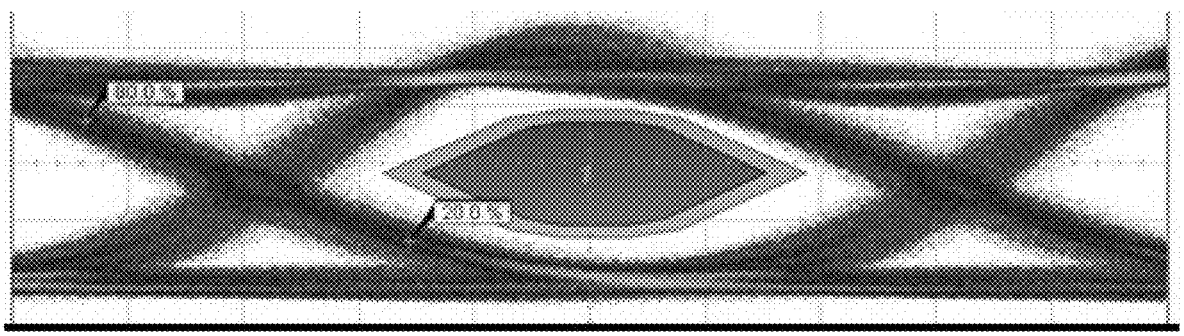
FIG. 10 is an output eye diagram of the conventional DFB laser configuration scheme with an external 3.3V power supply at −40° C. condition.

Embodiment 2: This embodiment is described below with reference to FIG. 7. According to the DFB laser DC-coupled output power configuration scheme with adjustable voltage difference of this embodiment, an internal power supply configuration unit is employed. Referring to FIG. 7, this configuration includes two parts, one part is the structural design of the internal power supply configuration unit, and the other part is the optimization of the transmitting unit TX of the optical transceiver integrated chip.

The power supply configuration scheme is:

Utilize a DC voltage source VDC3.3V as a working power supply of a DFB laser;

At the same time, arrange an internal power configuration unit inside an optical transceiver integrated chip. The working power supply of a transmitting unit TX of the optical transceiver integrated chip is obtained from the DC voltage source VDC3.3V after being processed by the internal power supply configuration unit.

In order to realized that: the working power supply of the transmitting unit TX of the optical transceiver integrated chip and the working power supply of the DFB laser DFB_Laser have a fixed voltage difference.

The specific connection relationship of each component is as follows: a positive terminal of the DC voltage source VDC3.3V is connected to both a power supply voltage port LVCC of the DFB laser DFB_Laser and a power supply voltage port TVCC of the transmitting unit TX of the optical transceiver integrated chip; a negative terminal of the DC voltage source VDC3.3V is grounded; an input terminal of an internal power configuration unit is connected to the power supply voltage port TVCC of the transmitting unit TX, an output terminal of the internal power configuration unit is connected to an internal working power port VCCT of the transmitting unit TX, a voltage differential modulation terminal of the internal power configuration unit is connected to a modulation port CTL of the transmitting unit TX.

The power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth.

After optimization, a minimum voltage of the power supply voltage port TVCC of the transmitting unit TX is 2.7V.

The internal power configuration unit includes a low-dropout linear voltage stabilizer, and the low-dropout linear voltage stabilizer includes a resistor R5, a resistor R6, a resistor R12, a resistor R13, a PMOS power resistor MP and an operational amplifier AMP;

one end of the resistor R6 is simultaneously connected to one end of the resistor R5 and an inverting input terminal of the operational amplifier AMP;

a non-inverting input terminal of the operational amplifier AMP is simultaneously connected to one end of the resistor R12 and one end of the resistor R13;

another end of the resistor R13 is simultaneously connected to a drain end of a PMOS power transistor MP and an internal working power port VCCT of the transmitting unit TX of the optical transceiver integrated chip;

a gate terminal of the PMOS power transistor MP is connected to an output terminal of the operational amplifier AMP;

a source terminal of the PMOS power transistor MP and another end of the resistor R5 are connected to a power supply voltage port TVCC of the transmitting unit TX;

another end of the resistor R12 and another end of the resistor R6 are connected to the ground;

the power configuration scheme optimizes the transmitting unit TX at the same time, the optimization scheme is that: the transmitting unit TX comprises transistors which are all low-voltage high-speed tubes, and the transmitting unit TX comprises a negative capacitance structure composed of capacitors C1 and C2 serving as an auxiliary structure for improving bandwidth;

after optimization, a minimum voltage of the power supply voltage port VCCT of the transmitting unit TX is 2.7V.

In addition, the internal power supply configuration unit further comprises a programmable module, and the programmable module is arranged to adjust resistance values of the resistor R5, the resistor R6, the resistor R12, an the resistor R13 so as to realize the adjustment of the voltage difference between the two working power sources.

The programmable module adopts an analog programmable module or a digital programmable module.

The digital programmable module is realized by a one-time programmable OTP or register programming. The process of voltage difference adjustment is: first determine a pre-realized voltage difference value between the two working power supplies, then write digital characters as commands through the modulation port CTL of the transmitting unit TX, and the programmable module rewrite the resistance value of the resistor R5, the resistor R6, the resistor R12, an the resistor R13 according to the commands so as to realize the voltage difference adjustment.

The analog programmable modules is realized by laser trimming or fuse trimming.

The working power supply voltage provided by the internal power supply configuration unit for the transmitting unit TX of the optical transceiver integrated chip is:

$$VCCT = VDC \cdot \frac{R6(R12 + R13)}{R12(R5 + R6)}.$$

In this case, the voltage difference between the working power supply of the DFB laser and the electric DC power supply of the transmitting unit TX of the optical transceiver integrated chip is:

$$VDC - VCCT = 3.3 - VDC \cdot \frac{R6(R12 + R13)}{R12(R5 + R6)}.$$

When the resistance values of the resistor R5, the resistor R6, the resistor R12, and the resistor R13 are determined, the voltage difference between the two is determined. When the required voltage difference needs to be adjusted, it can be achieved by modulating the resistance values of the above four resistors.

The change of the power configuration scheme in this embodiment can reduce the power consumption and cost of the entire module, and improve the quality of the laser output eye diagram. The principle is similar to that of the embodiment 1.

What is claimed is:

1. A DFB laser DC-coupled output power configuration scheme with adjustable voltage difference, characterized in that, said power configuration scheme comprising: an external power configuration unit for providing two electric DC power supplies with a fixed voltage difference for a DFB laser and a transmitting unit TX of an optical transceiver integrated chip, said external power configuration unit comprises a DC voltage source VDC3.3V and a LDO-like (low dropout-like) stabilizer, and said LDO-like stabilizer comprises a resistor R5, a resistor R6, a resistor R12, a resistor R13, a PMOS power resistor MP and an operational amplifier AMP;
   one end of the resistor R6 is simultaneously connected to one end of the resistor R5 and the inverting input terminal of the operational amplifier AMP;
   a non-inverting input terminal of the operational amplifier AMP is simultaneously connected to one end of the resistor R12 and one end of the resistor R13;
   another end of the resistor R13 is simultaneously connected to a drain end of a PMOS power transistor MP and a voltage output port $V_{OUT}$, and the voltage output port $V_{OUT}$ is arranged to output a working power of the transmitting unit TX of the optical transceiver integrated chip, the voltage output port VOUT is connected to a power supply voltage port TVCC of the transmitting unit TX;
   a gate end of the PMOS power transistor MP is connected to an output terminal of the operational amplifier AMP;
   a source end of the PMOS power resistor MP and another end of the resistor R5 are connected to a positive terminal of the DC voltage source VDC;
   another end of the resistor R12, another end of the resistor R6 and a negative terminal of the DC voltage source VDC are connected to the ground;
   said power configuration scheme optimizes said transmitting unit TX at the same time, an optimization scheme to optimize said transmitting unit TX is that: said transmitting unit TX comprises transistors which are all low-voltage high-speed tubes, and said transmitting unit TX comprises a negative capacitance structure composed of capacitors C1 and C2 serving as an auxiliary structure for improving bandwidth;
   a minimum voltage of said power supply voltage port TVCC of said transmitting unit TX is 2.7V after optimization.

2. The DFB laser DC-coupled output power configuration scheme with adjustable voltage difference according to claim 1, characterized in that, a working power supply voltage provided by said external power supply configuration unit for said transmitting unit TX of said optical transceiver integrated chip is:

$$V_{OUT} = VDC \cdot \frac{R6(R12 + R13)}{R12(R5 + R6)}$$

by adjusting resistance values of said resistor R5, said resistor R6, said resistor R12, and said resistor R13, said output voltage $V_{OUT}$ is changed, and hence said voltage difference between said two DC power supplies is adjusted.

3. The DFB laser DC-coupled output power configuration scheme with adjustable voltage difference, characterized in that, said power configuration scheme comprises:
   a DC voltage source VDC3.3V utilized as a working power supply of a DFB laser;
   an internal power configuration unit arranged inside an optical transceiver integrated chip, and a working power supply of a transmitting unit TX of said optical transceiver integrated chip is obtained from said DC voltage source VDC3.3V after being processed by said internal power supply configuration unit;
   in order to realize that: said working power supply of said transmitting unit TX of said optical transceiver integrated chip and said working power supply of said DFB laser have a fixed voltage difference;
   specifically: a positive terminal of the DC voltage source VDC3.3V is simultaneously connected to a power supply voltage port LVCC of said DFB laser and a power supply voltage port TVCC of said transmitting unit TX of said optical transceiver integrated chip; a negative terminal of said DC voltage source VDC3.3V is grounded; an input terminal of said internal power configuration unit is connected to said power supply voltage port TVCC of said transmitting unit TX, an output terminal of said internal power configuration unit is connected to an internal working power port VCCT of said transmitting unit TX, a voltage differential modulation terminal of said internal power configuration unit is connected to a modulation port CTL of said transmitting unit TX;
   said power configuration scheme optimizes said transmitting unit TX at the same time, an optimization scheme to optimize said transmitting unit TX is that: said transmitting unit TX comprises transistors which are all low-voltage high-speed tubes, and said transmitting unit TX comprises a negative capacitance structure composed of capacitors C1 and C2 serving as an auxiliary structure for improving bandwidth;
   a minimum voltage of said internal power supply voltage port VCCT of said transmitting unit TX is 2.7V after optimization.

4. The DFB laser DC-coupled output power configuration scheme with adjustable voltage difference according to claim 3, characterized in that, said internal power supply configuration unit comprises a low dropout linear voltage stabilizer, said low dropout linear voltage stabilizer comprises a resistor R5, a resistor R6, a resistor R12, a resistor R13, a PMOS power resistor MP and an operational amplifier AMP;

one end of said resistor R6 is simultaneously connected to one end of said resistor R5 and an inverting input terminal of said operational amplifier AMP;

a non-inverting input terminal of said operational amplifier AMP is simultaneously connected to one end of said resistor R12 and one end of said resistor R13;

another end of said resistor R13 is simultaneously connected to a drain end of said PMOS power transistor MP and an internal working power port VCCT of said transmitting unit TX of said optical transceiver integrated chip;

a gate terminal of said PMOS power transistor MP is connected to an output terminal of said operational amplifier AMP;

a source terminal of said PMOS power transistor MP and another end of said resistor R5 are connected to a power supply voltage port TVCC of said transmitting unit TX;

another end of said resistor R12 and another end of said resistor R6 are connected to the ground;

said power configuration scheme optimizes said transmitting unit TX at the same time, said optimization scheme is that: said transmitting unit TX comprises transistors which are all low-voltage high-speed tubes, and said transmitting unit TX comprises a negative capacitance structure composed of capacitors C1 and C2 serving as an auxiliary structure for improving bandwidth;

a minimum voltage of said power supply voltage port TVCC of said transmitting unit TX is 2.7V after optimization.

5. The DFB laser DC-coupled output power configuration scheme with adjustable voltage difference according to claim 4, characterized in that, said internal power supply configuration unit comprises a programmable module, and said programmable module is arranged to adjust resistance values of said resistor R5, said resistor R6, said resistor R12, said resistor R13 so as to realize an adjustment of said voltage difference between said two working power sources.

6. The DFB laser DC-coupled output power configuration scheme with adjustable voltage difference according to claim 5, characterized in that, said programmable module adopts an analog programmable module or a digital programmable module.

7. The DFB laser DC-coupled output power configuration scheme with adjustable voltage difference according to claim 6, characterized in that, said digital programmable module is realized by a one-time programmable OTP or register programming, and a process of voltage difference adjustment is: first determine a pre-realized voltage difference value between said two working power supplies, then write digital characters as commands through a modulation port CTL of said transmitting unit TX, and said programmable module rewrite a resistance value of said resistor R5, said resistor R6, said resistor R12, and said resistor R13 according to said commands so as to realize said adjustment of voltage difference.

8. The DFB laser DC-coupled output power configuration scheme with adjustable voltage difference according to claim 6, characterized in that, said analog programmable modules is realized by laser trimming or fuse trimming.

9. The DFB laser DC-coupled output power configuration scheme with adjustable voltage difference according to claim 3, characterized in that, said working power supply voltage provided by said internal power supply configuration unit for said transmitting unit TX of said optical transceiver integrated chip is:

$$VCCT = VDC \cdot \frac{R6(R12 + R13)}{R12(R5 + R6)}.$$

\* \* \* \* \*